United States Patent [19]

Cassinelli

[11] Patent Number: 4,652,065
[45] Date of Patent: Mar. 24, 1987

[54] METHOD AND APPARATUS FOR PROVIDING A CARRIER TERMINATION FOR A SEMICONDUCTOR PACKAGE

[75] Inventor: Edgar R. Cassinelli, Marlboro, Mass.
[73] Assignee: Prime Computer, Inc., Natick, Mass.
[21] Appl. No.: 701,575
[22] Filed: Feb. 14, 1985
[51] Int. Cl.[4] .............................................. H01R 9/09
[52] U.S. Cl. ............................. 339/17 CF; 29/830; 338/308; 361/414
[58] Field of Search ................. 339/17 CF, 17 E; 361/395, 396, 400, 401, 402, 403, 414; 174/52 FP; 357/74, 80; 29/830; 338/308, 309, 320

[56] References Cited

U.S. PATENT DOCUMENTS

| | | | |
|---|---|---|---|
| 3,365,620 | 1/1968 | Butler et al. | 361/401 |
| 3,418,535 | 12/1968 | Martinell | 361/407 |
| 3,588,616 | 6/1971 | Palazzini | 361/402 |
| 3,964,087 | 6/1976 | Mallon | 339/17 C |
| 4,342,069 | 7/1982 | Link | 361/401 |
| 4,407,007 | 9/1983 | Desai et al. | 357/74 |

FOREIGN PATENT DOCUMENTS 47-25549  7/1972  Japan ............................. 339/17 CF

OTHER PUBLICATIONS

IBM Bulletin, Fedrowitz et al., vol. 20, No. 12, p. 5172, 5-1978.
IBM Bulletin, Falda, vol. 23, No. 12, p. 5410, 5-1981.

Primary Examiner—Neil Abrams
Attorney, Agent, or Firm—Lahive & Cockfield

[57] ABSTRACT

A semiconductor termination socket for use with a printed wiring board has a mounting socket base for attachment to the board and plural pin socket receiving elements in the base for connecting to leads of a semiconductor chip package which will be removably inserted into the socket. The socket further has electrical components fabricated within the socket base for connecting a pin of the socket and a termination potential. The electrical components are preferably fabricated using planar technology so that the socket becomes, in essence, a printed wiring board. The semiconductor packages can be of any configuration including, for example, 149 pin grid array packages. If more than one layer of component circuitry is needed, a plurality of layers can be embedded within the mounting socket.

9 Claims, 9 Drawing Figures

METHOD AND APPARATUS FOR PROVIDING A CARRIER TERMINATION FOR A SEMICONDUCTOR PACKAGE

BACKGROUND OF THE INVENTION

The invention relates generally to semiconductor and component packaging technology and in particular to a method and apparatus for providing line terminating networks for a semiconductor chip package.

In a typical printed wiring board configuration, a mounting socket is electrically connected, permanently, for example by wave soldering, to the printed wiring board, and a semiconductor package is inserted into the socket. Discrete components are connected between the printed wiring board socket connections and, for example, termination potentials required by the semiconductor chip for proper operation. As the number of terminals on the semiconductor chip package grows, the available space on the printed wiring board becomes increasingly crowded and, for example, it may occur that fewer semiconductor packages can be mounted on a board because of the number of discrete components required therefor.

One solution to this problem is to employ planar technologies to produce planar components within the printed wiring board itself, for example the many termination resistors required by the semiconductor package. This solution to the component crowding problem is expensive, however, because of the large number of initially rejected boards which have one or more bad parts embedded therein. As a result, the manufacturing process of employing planar technology in the printed wiring board requires several additional quality control and rework process steps to ensure that a large board, which may contain as many as, for example, five thousand planar termination resistors, is acceptable.

Furthermore, when dealing with high density ECL technology, the number of routing channels, normally two for other semiconductor technologies, increases to three, and further, ECL technology requires that the routing channel connection be made first to the terminal of the semiconductor socket and then to the terminating component. There results therefore a severe congestion in the printed wiring board.

Primary objects of the invention, therefore, are to alleviate the component crowding on a printed wiring board and to provide faster, more reliable circuitry, and to connect semiconductor packages to a printed wiring board in a manner which is less expensive than that previously known. Other objects of the invention are to increase the density of semiconductor functions on a printed wiring board, thereby increasing the compactness and speed of the circuitry.

SUMMARY OF THE INVENTION

In one aspect, the invention relates to an improved semiconductor mounting socket. The socket has a mounting socket base with plural socket pins extending therethrough for connecting to leads of a semiconductor chip package. The invention features mounting electrical component termination circuitry within the socket base for connection between a pin and a termination potential. The socket bases can be for example a pin grid array package base or a base for a dual in-line package. As will become apparent from the description hereinafter, any pin configuration of mounting socket base can be employed.

In a particular embodiment of the invention, the semiconductor termination socket features a laminated socket base construction having at least a three layer structure. The pin receiving socket elements extend through each of the three layers for connecting leads of the semiconductor package to the printed wiring board. The socket base features a layer having formed therein a plurality of planar resistive components each component being connected between one of the pins and a termination potential.

Preferably, the laminated socket base further features a ground plane layer, the layer having the planar components therein, and a surface mounted component layer. The base further has a plurality of insulating dielectric layers separating and electrically insulating the ground, planar component carrying, and surface component carrying layers. Standard printed wiring board technology is employed for interconnecting and adhering the layers.

In another aspect, the invention relates to a method for manufacturing a semiconductor termination socket featuring the steps of providing at least, two, and preferably at least three, circuit layers, each layer being spaced apart from each other circuit layer by an electrically insulating dielectric layer, providing on one of the circuit layers a planar resistive structure having a plurality of planar resistive components and connecting at least one of the resistive components between a chip socket pin extending through at least the one layer and a source of terminating potential.

DESCRIPTION OF THE DRAWINGS

Other objects, features, and advantages of the invention will appear from the following description of a preferred embodiment taken together with the drawings in which.

DESCRIPTION OF A PREFERRED EMBODIMENT

Figure 1:
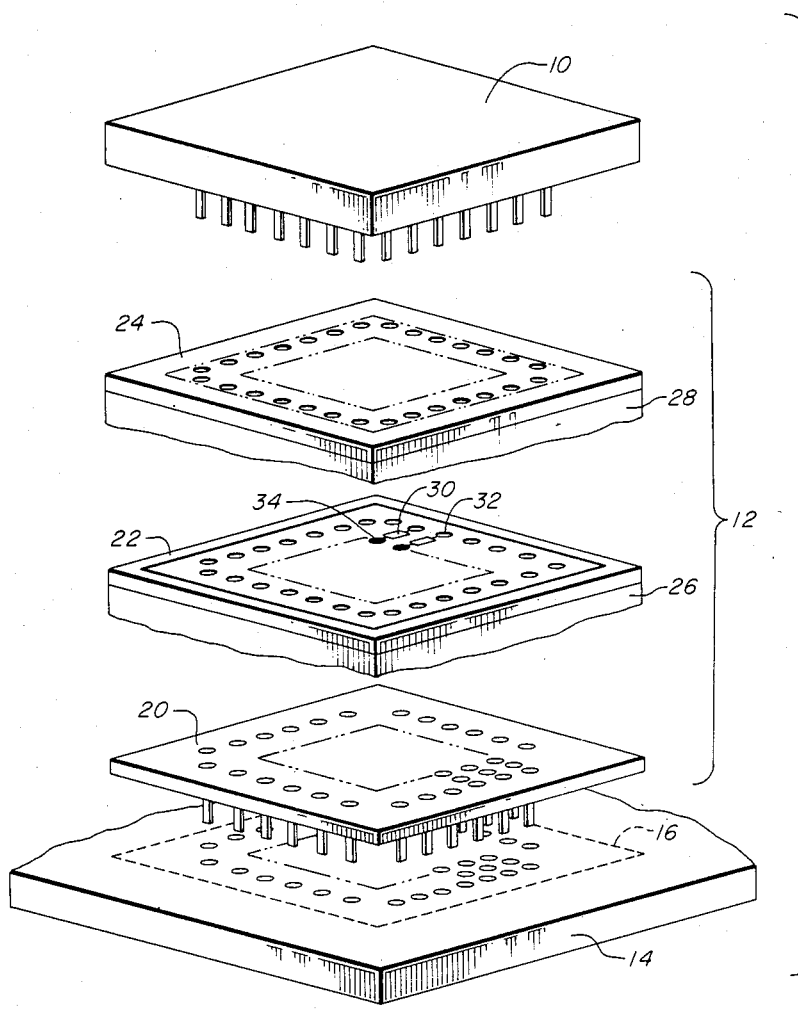
FIG. 1 is an exploded view showing the three layers of a semiconductor mounting socket according to the preferred embodiment of the invention.

Referring to FIG. 1, a semiconductor chip 10, for example a 149 pin grid array package, electrically mates with, and is inserted into, a carrier termination structure, here a semiconductor mounting socket 12 for connection to a printed wiring board 14. The printed wiring board 14 typically has a receptor pattern 16 to which the semiconductor socket 12 is permanently attached. The printed wiring board 14 further has other components mounted thereon for properly routing and controlling the signal flow between and to the semiconductor mounting sockets.

In accordance with the illustrated embodiment of the invention, the semiconductor mounting socket is a laminate structure having three layers, a ground plane layer 20, a middle planar component carrying layer 22, and a surface component carrying layer 24. The layers each carry electrical signals thereon and are electrically insulated and spaced apart from each other by dielectric material 26, 28. Conventional printed wiring board technology, as described in more detail below, can be employed in fabricating the three layer structure as is well known in the art. In other embodiments of the invention, more component carrying layers can be employed, if, for example, a single layer cannot contain all of the required component structures. Further, the position of the component layer 22 in the stack of layers can be varied.

In accordance with the preferred embodiment of the invention, the middle layer 22 (or layers if there is more than one) has thereon a plurality of planar termination components 30 which have been produced using standard planar technology. The components 30, which are schematically illustrated in FIG. 1, typically connect between a pin location 32, which connects electrically to a pin of the semiconductor chip package 10, and a source of terminating potential 34, provided by a connection, in this illustrated embodiment, to the top layer 24. The middle layer can contain as many as, for example, 120 terminating components or more, for, for example, a 149 pin semiconductor package. Accordingly, the termination components thereby removed from the printed wiring board 14, allow higher packing density, if desired, of chip components, and further providing shorter lead lengths to help reduce noise and improve processing speed of the semiconductor circuitry.

This structure further advantagously minimizes the cost of terminating semiconductor chip packages by modularizing the requirement that all components on the entire wiring board be in proper working order. Thus instead of building the five thousand or more components, such as components 30, during the same process sequence, thus almost assuring that one or more of the structures will be defective, a majority of the component structure is built into a modular carrier terminator, here the semiconductor socket. As a result, a defective component, instead of causing an entire board to be rejected, only causes a single terminator to be rejected. Thus, according to the invention, if a semiconductor socket base has a defective component part, it can be discarded or repaired without affecting the up to fifty or more other socket bases used for the particular wiring board. Correspondingly, the fabrication cost of the printed wiring board employing the claimed invention is significantly lower than that of boards employing prior fabrication methods.

Figure 2:
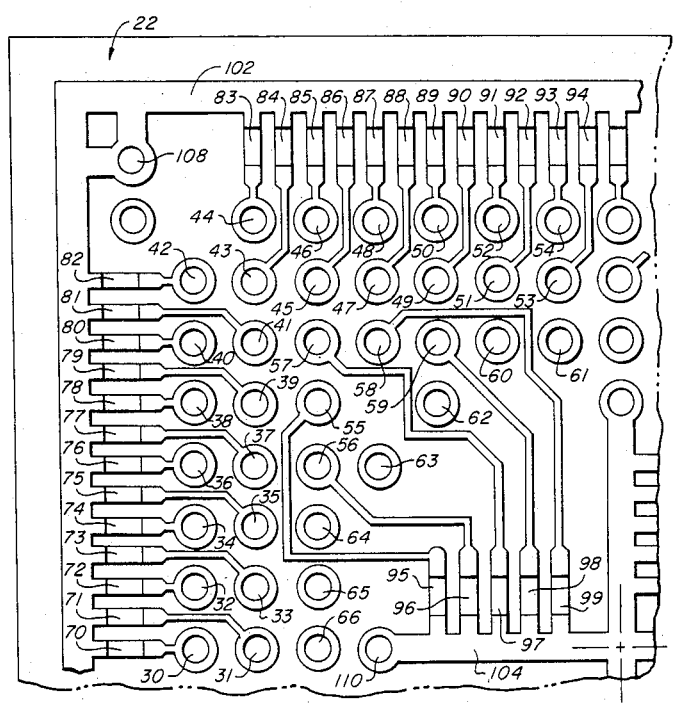
FIG. 2 is a drawing showing a plan view of one quadrant of the planar component carrying layer of a three layer, 149 pin socket base according to a preferred embodiment of the invention.

Referring now to FIG. 2, the planar component carrying layer, after fabrication, but prior to laminating with the other layers of the structure, has exposed copper pads and connecting lines, a thin exposed, resistive coating where the terminating resistors are formed, and base dielectric area elsewhere. Each quadrant of the illustrated layer 22 of the base socket for a typical 149 pin grid array has a resistor termination component configuration for terminating thirty terminal pins of the semiconductor package using planar resistor components. (Thus for the entire layer 22, one hundred and twenty pins of the semiconductor package can be terminated.)

The component carrying layer 22 has exposed copper pads 30–66 in illustrated quadrant. Each of pads 30–59 connects electrically to one end of a respective resistive component 70–99 fabricated on the middle layer as described hereinafter. The other end of each resistive component connects to a terminating potential, in the illustrated embodiment using ECL technology, of −2 volts. The −2 volt lines are provided on the layer surface by exposed conductive copper strips 102 and 104. Conductive strip 102 extends around the periphery of the layer 22 and receives its potential from through vias at pads 108, located in each corner of the layer. The conductive strip 104 provides the terminating potential in the middle of the layer, and receives its potential through four vias fabricated at pads 110.

Referring to FIGS. 4A–4D, the structure of the laminate socket can be better understood by referring to the masks 120, 122, 124, and 126 employed during the manufacturing process. Mask 120 is a mask employed for fabricating layer 24, masks 122 and 124 are employed for fabricating the planar component carrying layer 22, and mask 126 is employed for fabricating layer 20.

Figure 5:
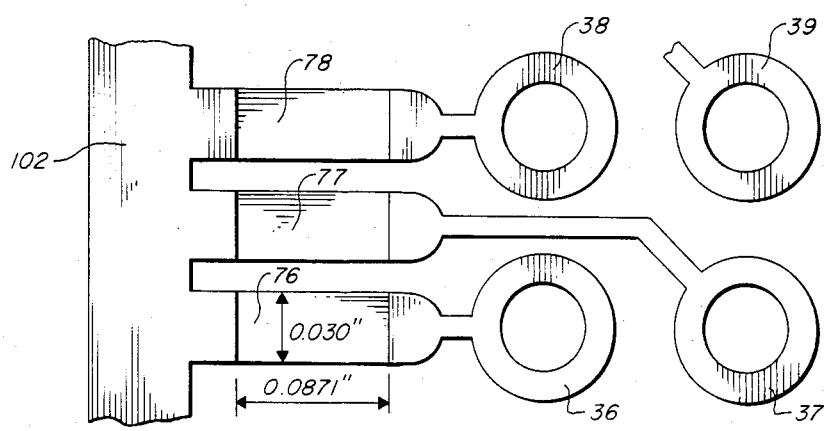
FIG. 5 is a more detailed view of a portion of FIG. 2.
Figure 6:
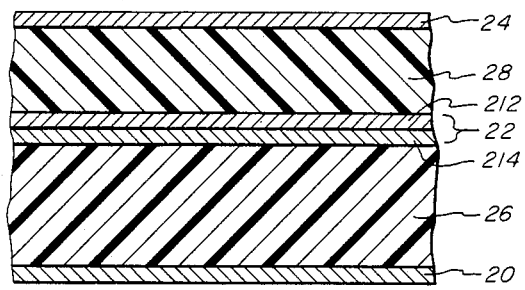
FIG. 6 is a cross-sectional view of one assembled terminator structure according to the invention.

Referring to FIG. 6, the illustrated laminate structure has as its upper layer 24 a copper cladding which has been etched in accordance with the pattern of mask 120. Secured to the upper layer at pads 400, 402 (FIG. 3) are a plurality of surface mounted capacitors 128 which provide filtering for the power available to the mounting socket. More or fewer surface mounted components can be employed in accordance with the claimed invention. The socket can provide, by enlarging its upper layer, substantial surface in addition to that available on and within the printed wiring board. As noted hereinafter, the layer 24 is adhered, prior to etching, to the underlying dielectric layer 28 using heat and pressure. The dielectric layer 28 acts to separate layers 22 and 24 both electrically and spatially. The layer 22 is a two component layer having a resistive layer 214 and a covering copper cladding 212. These layers are etched during a multi-stage fabrication process employing masks 122 and 124. Referring to FIG. 5, the resulting planar resistors, formed in the resistive coating exposed portions of layer 214 are typically 0.030 inches in width and 0.071 inches in length. This provides, using a resistive rating of twenty-five ohms per square, a sixty-eight ohm termination resistance. Other values of termination resistance, such as, for example, fifty ohms, can also be provided. Beneath the resistive layer is the second dielectric layer 26 which spaces the resistive layer from the etched ground plane copper cladding layer 20. The ground plane copper cladding layer has been etched in accordance with mask 126.

In accordance with standard manufacturing techniques, the starting material for layers 20 and 22 and dielectric and insulating material 26 is a standard cured board material having a copper cladding on one side, corresponding to what will become the ground plane layer 20, and a resistive coating covered with a copper cladding on its other side, corresponding to what will become layer 22.

The mask 126 is employed for removing copper material from those locations on the ground plane layer 20 at which a non-grounding or via connection will be effected. Thus, copper will be removed from those unexposed areas corresponding to a black circular pattern 130 or a partial black circular pattern 132. With respect to the full circular pattern 130, there result a plurality of fully isolated regions at the locations defined by a pattern 130. The regions are electrically isolated from the remaining copper cladding so that a pin receiving element, for example, a machine lead socket, passing within the region defined by the circular pattern, is not in electrical contact with the surrounding copper ground plane. With respect to the partial circular patterns 132, however, a pass-through hole, or via, extending therethrough and properly plated, provides an electrical connection, as required, between the ground plane and pins of the semiconductor package, the middle layer, and/or the top layer as described further below.

Masks 122 and 124 define the layer structure illustrated in FIG. 2. In accordance with standard printed wiring board techniques, the copper layer-over-resistive layer-over-dielectric surface is first coated with a photoresist which is then exposed through the mask 122. The photoresist is then developed thus exposing the copper therebeneath. The areas which appear white (or clear) in the mask 122 are to be etched. The copper and the underlying resistive coating material are then etched and removed. As a result, the width of the resistors 30 and the copper interconnections are defined.

Mask 124 is then employed to define the length of the resistors. After mask 124 is registered with the pattern on what will become the middle layer of the illustrated laminated base socket, the layer is again coated with photoresist and a negative exposure is made through mask 124. In this exposure, after the photoresist is developed, those photoresist areas corresponding to black on mask 126 are removed, exposing the copper therebeneath. The exposed copper is etched leaving the resistive material layer behind and forming the now completed resistors 30. This process thus defines the length of the resistor.

Figure 3:
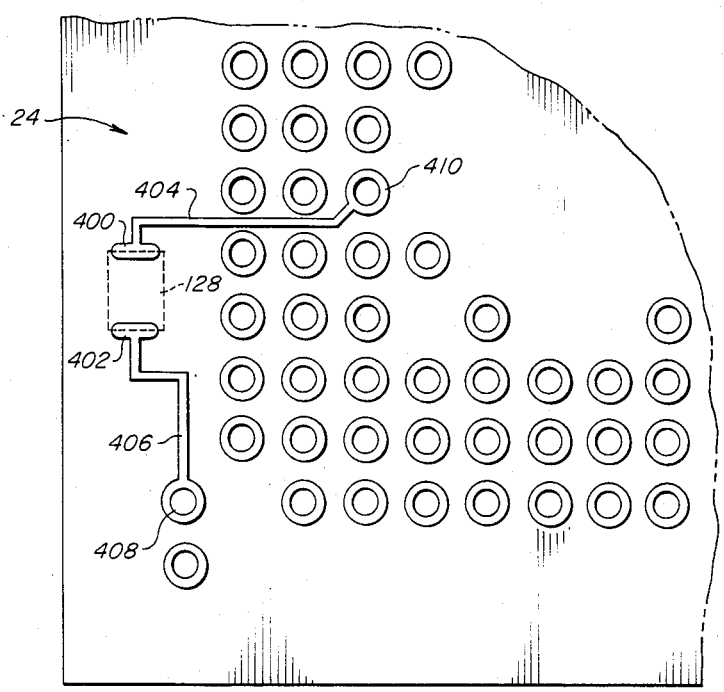
FIG. 3 is a drawing showing one quadrant of a top layer of the 149 pin socket base of FIG. 2.
Figure 4A:
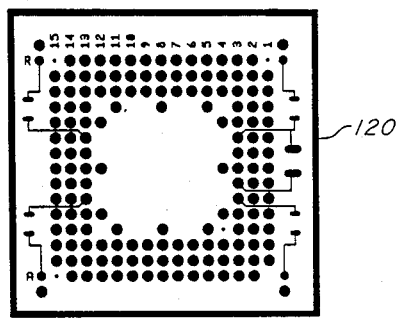
FIGS. 4A–4D show the mask structure for manufacturing the various layer structures of the socket base of FIGS. 1, 2 and 3.
Figure 4B:
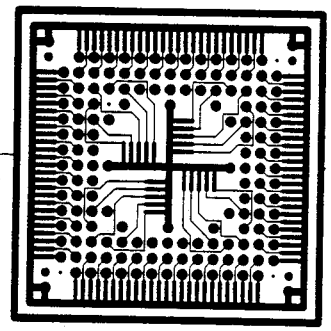
Figure 4C:
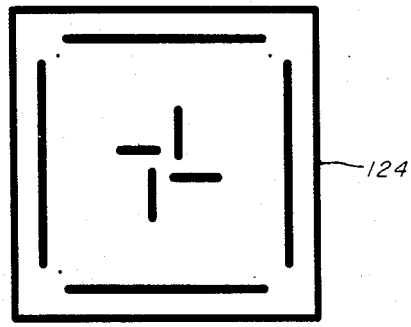
Figure 4D:
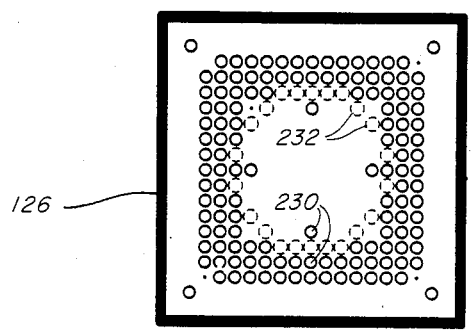

According to the preferred embodiment of the invention, after the elements of layers 20 and 22 have been etched, the layer 24 and dielectric layer 28 are laid on layer 22 for completing fabrication of the integral structure. The resulting sandwich assembly is exposed to both pressure and thermal processing to positively adhere the layers together. As is well known in the art, the upper dielectric layer can be a prepreg, also known as a B-stage material, and is not completely cured. Upon the application of pressure and temperature, this material cures and adheres to a copper sheet thereabove and the contacting materials of layers 22 and 26 below. Thereafter, the copper layer 24 is etched, and holes are drilled in the laminated structure to enable vias to be fabricated by an electroplating process, for example, at areas 408, 410 (FIG. 3). The vias can also receive the socket terminals. The vias provide the connections by which ground, terminating, and other potentials are applied to selected layers as needed. The process for forming the vias by the electroplate process is well known in the art.

The illustrated top layer 28 is formed using mask 120. Mask 120 defines the pattern of holes which receive the pin receiving sockets. The pattern also defines the vias which provide, inter alia, connections for surface mounted components such as filtering capacitors. Thus, referring to mask 120, those areas in black correspond to areas where copper cladding will remain while the areas in white or clear will have the copper cladding etched therefrom.

Referring to FIG. 3, the top layer of the illustrated laminate structure has a plurality of pads 400, 402 connected via conductors 404, 406 to a ground potential through a via 408 and to a supply voltage through a via 410. The surface mounted components, such as capacitors, can be connected to this layer at pads 400, 402 and provide filtering of the supply voltage as noted above.

There results a socket terminator having a laminate wired board structure and at least one layer, preferably a middle layer, containing planar terminating resistive components. Two or more layers could also be employed for planar components when the number of required components cannot be placed on a single layer. The printed wiring board multilayer techniques for achieving the laminate structure are well known to those in the printed wiring board art.

Additions, subtractions, deletions, and other modifications of the above-described embodiment will be apparent to those practiced in the art and are within the scope of the following claims.

What is claimed is:

1. A semiconductor termination socket comprising
   an integral laminated socket base having at least a three layer structure, said laminated base having
      a ground plane layer, and
      insulating dielectric layers between said ground plane, a middle, and a third layer for separating and electrically insulating said ground plane, middle, and third layers,
   plural pin receiving socket means extending through said base for receiving and connecting each lead of a semiconductor package to a printed wiring board, and
   said socket base having at least one said middle layer having formed therein a plurality of planar resistive termination components, each component connected between a said pin receiving socket means and a termination potential.

2. The semiconductor termination socket of claim 1 wherein said laminated socket base third layer comprises
   a surface component carrying layer.

3. The semiconductor termination socket of claim 2 wherein said base further comprises
   a plurality of vias extending through said layers for connecting a circuit connector on one said layer to a circuit connector on another layer.

4. The semiconductor termination socket of claim 2 wherein said base further comprises
   mounting pads on said top layer,
   means for connecting each pad to a via for connection to a selected potential, and
   surface mounted electrical components connected to said base at said pads.

5. A method for manufacturing a semiconductor termination socket comprising the steps of
   providing at least two circuit layers, each said circuit layer being spaced apart from each other circuit layer by an electrically insulating dielectric layer,
   providing on one of said circuit layers a planar resistive structure having a plurality of resistive components,
   providing an adjacent circuit layer as a ground layer,
   establishing conductive sockets extending through said circuit layers for receiving a terminal package at one end thereof and connecting to a wiring board at the other end thereof, and
   connecting each of a plurality of said resistive components between a said conductive socket extending therethrough and a source of terminating potential so as to form an integral laminated termination socket.

6. The method of claim 5 further comprising the step of
   providing on a top layer of said circuit layers, pads for connecting surface mounted circuit elements to said terminating socket.

7. The method of claim 5 further comprising the step of
   providing one of said layers as a surface mounted component carrying layer.

8. The method of claim 5 where there are three circuit layers.

9. A printed wiring board system comprising
   a printed wiring board,
   a plurality of semiconductor package receiving base sockets,
   means for mounting said sockets on said printed wiring board,
   each said socket being a laminated socket base having
      at least a three layer structure of electrically active elements including a middle layer comprising a planar resistor structure contained therein for terminating pins of a semiconductor package, and
      a ground plane layer adjacent to the middle layer, and
   pin receiving socket means extending through said base for receiving a said semiconductor package and for connecting pins of said received package to respective resistors of said planar structure, a plurality of planar resistive components forming said planar resistive structure, each resistive component being connected between a said pin receiving socket means and a terminating potential.

* * * * *